(12) United States Patent
Matsushima et al.

(10) Patent No.: US 11,848,126 B2
(45) Date of Patent: Dec. 19, 2023

(54) CABLE STOPPER STRUCTURE AND IMAGE FORMING APPARATUS

(71) Applicants: CITIZEN WATCH CO., LTD., Tokyo (JP); CITIZEN SYSTEMS JAPAN CO., LTD., Tokyo (JP)

(72) Inventors: Gen Matsushima, Tokorozawa (JP); Takeo Komiyama, Higashikurume (JP); Hiroyuki Yasuda, Kawasaki (JP); Katsunori Shimizu, Higashimurayama (JP)

(73) Assignees: CITIZEN WATCH CO., LTD., Tokyo (JP); CITIZEN SYSTEMS JAPAN CO., Tokyo (JP)

( * ) Notice: Subject to any disclaimer, the term of this patent is extended or adjusted under 35 U.S.C. 154(b) by 404 days.

(21) Appl. No.: 17/055,574

(22) PCT Filed: Nov. 11, 2019

(86) PCT No.: PCT/JP2019/044148
§ 371 (c)(1),
(2) Date: Nov. 14, 2020

(87) PCT Pub. No.: WO2020/105493
PCT Pub. Date: May 28, 2020

(65) Prior Publication Data
US 2021/0118591 A1    Apr. 22, 2021

(30) Foreign Application Priority Data
Nov. 22, 2018 (JP) .................. 2018-219087

(51) Int. Cl.
*H01B 7/08* (2006.01)
*B41J 2/32* (2006.01)
(Continued)

(52) U.S. Cl.
CPC .............. *H01B 7/0869* (2013.01); *B41J 2/32* (2013.01); *B41J 29/02* (2013.01); *H01B 7/18* (2013.01)

(58) Field of Classification Search
CPC .. H01B 7/0869; H01B 7/18; B41J 2/32; B41J 29/02; B41J 2/335; B41J 29/13; H02G 3/30; H05K 7/00
See application file for complete search history.

(56) References Cited

U.S. PATENT DOCUMENTS

2006/0092261 A1* 5/2006 Han ........................ B41J 2/35
                                                                 347/211
2019/0346804 A1   11/2019 Tamura

FOREIGN PATENT DOCUMENTS

JP       59-137060 U    9/1984
JP       61-059054 U    4/1986
(Continued)

OTHER PUBLICATIONS

Sen, Len-jian; Flat Cable And Electronic Device, May 1, 2018, China, All Pages (Year: 2018).*

(Continued)

*Primary Examiner* — Justin Seo
*Assistant Examiner* — Tracey M McMillion
(74) *Attorney, Agent, or Firm* — TUCKER ELLIS LLP (57) ABSTRACT

A cable stopper structure and an image forming apparatus includes a cable disposed throughout a first passage and a second passage, the second passage having a ceiling height higher than a ceiling height of the first passage, a first component disposed in the first passage and connected to one end portion of the cable, and a second component disposed near an exit of the first passage and connected to the other end portion of the cable, the second component being removable in a direction away from the first component. The cable includes a folded-back portion folded back (Continued)

in the second passage and a rigid portion disposed between the folded-back portion and the first component. The rigid portion has a rigidity greater than that of the cable and has a length in a pulling-out direction of the cable longer than the ceiling height of the first passage.

12 Claims, 7 Drawing Sheets

(51) Int. Cl.
    *B41J 29/02*     (2006.01)
    *H01B 7/18*     (2006.01)

(56) References Cited

FOREIGN PATENT DOCUMENTS

| JP | 2004-299407 A | | 10/2004 |
|---|---|---|---|
| JP | 2005-197419 A | | 7/2005 |
| JP | 2006-263959 A | | 10/2006 |
| JP | 2017076747 A | * | 4/2017 |
| JP | 2018018983 A | | 2/2018 |

OTHER PUBLICATIONS

Kimura, Yoji; Lid Body Attachment Structure for Flat Cable Insertion Hole and Electronic Apparatus, Apr. 20, 2017, Japan, All Pages (Year: 2017).*

International Search Report from corresponding International Patent Application No. PCT/JP2019/044148, dated Jan. 21, 2020, 5 pages including translation.

Japanese Decision to Grant Patent from corresponding Japanese Application No. 2018219087, dated Mar. 8, 2022, 2 pages.

* cited by examiner

CABLE STOPPER STRUCTURE AND IMAGE FORMING APPARATUS

CROSS-REFERENCE TO RELATED APPLICATION

This application is based upon and claims the benefit of priority from Japanese Patent Application No. 2018-219087 filed on Nov. 22, 2018, the entire disclosure of which is incorporated herein by reference.

TECHNICAL FIELD

The present disclosure relates to a cable stopper structure for a cable disposed inside of a housing and an image forming apparatus.

BACKGROUND ART

For example, it has been known that a main board disposed inside a housing of an image forming apparatus is connected to a connector attached to a head unit or a cutter unit with a flexible flat cable (FFC) or the like (for example, refer to Patent Literature 1: JP 2004-299407 A).

Patent Literature 1 discloses a configuration in which a main circuit board to control a printer is connected to a connector provided to a print head with a flexible flat cable (FFC) or the like. With such a configuration, it is common that a connector is also used for a connection of the FFC onto the main circuit board.

SUMMARY

In an image forming apparatus configured in this way, in the case of exchanging a print head, it is necessary to pull an FFC by removing the print head from a printer and to remove the FFC from a connector provided to the print head. However, in the configuration described in Patent Literature 1, pulling the FFC excessively for removing the head print from the printer may cause a trouble such that the FFC is disconnected from the connector provided to the main circuit board.

Therefore, an object of the present disclosure is to provide a cable stopper structure and an image forming apparatus capable of, with a simple configuration, preventing a trouble such as disconnection of a cable when pulling the cable.

In order to achieve the above-described object, a cable that is disposed throughout a first passage and a second passage, the second passage being connected to an entrance of the first passage and having a ceiling height higher than a ceiling height of the first passage, a first component that is disposed in the first passage and connected to one end portion of the cable, and a second component that is disposed near an exit of the first passage and connected to the other end portion of the cable, the second component being configured to be removable in a direction away from the first component, wherein the cable comprises a folded-back portion that is folded back in the second passage and a rigid portion that is disposed at a position between the folded-back portion and the first component, wherein the rigid portion has a rigidity greater than that of the cable and has a length in a pulling-out direction of the cable longer than the ceiling height of the first passage.

DESCRIPTION OF EMBODIMENTS

Hereinafter, an embodiment for realizing a cable stopper structure and image forming apparatus according to the present disclosure will be described on the basis of a first embodiment shown in the drawings.

First Embodiment

The cable stopper structure and the image forming apparatus in the first embodiment are applied to a thermal printer to perform printing on a thermal paper.

Configuration of Thermal Printer

Figure 1:
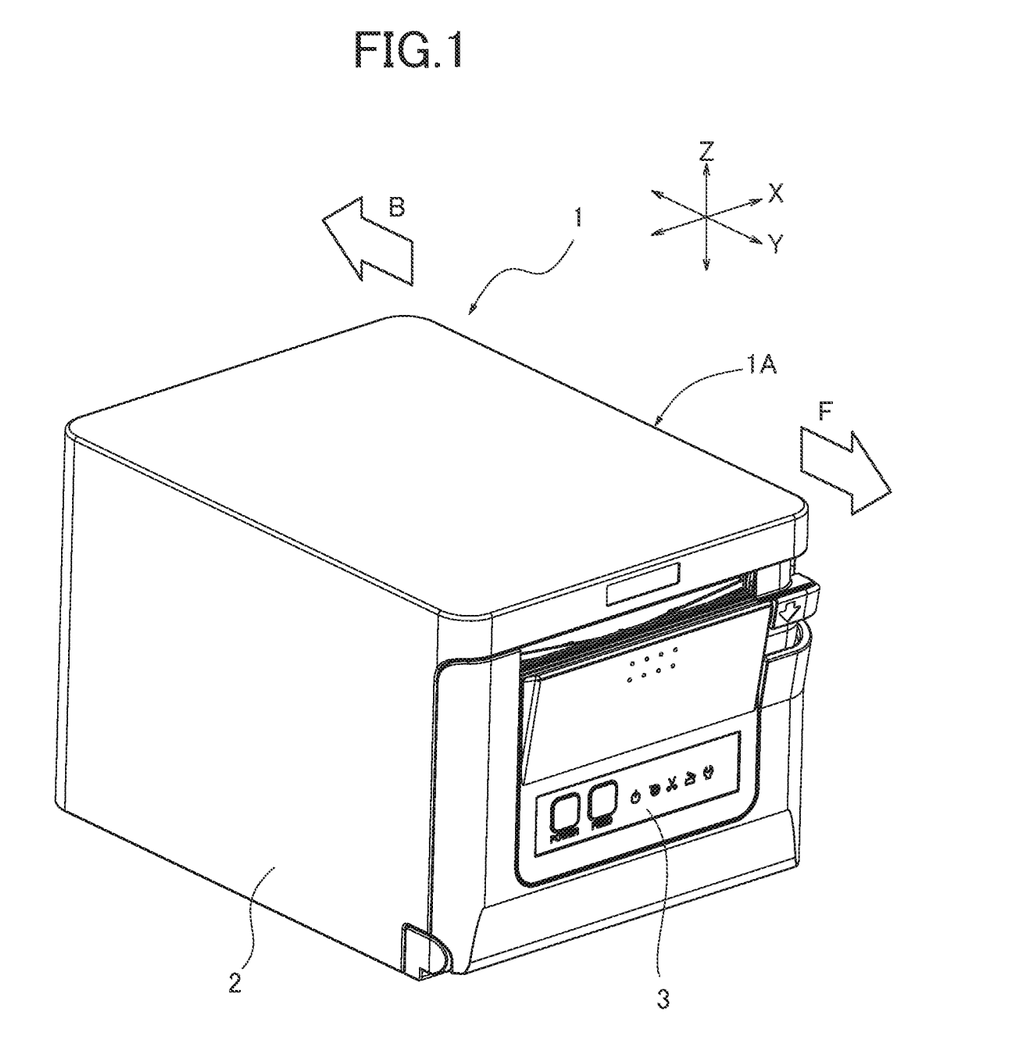
FIG. 1 is a perspective view showing a state where a front cover of a thermal printer in a first embodiment is at a closed position.
Figure 2:
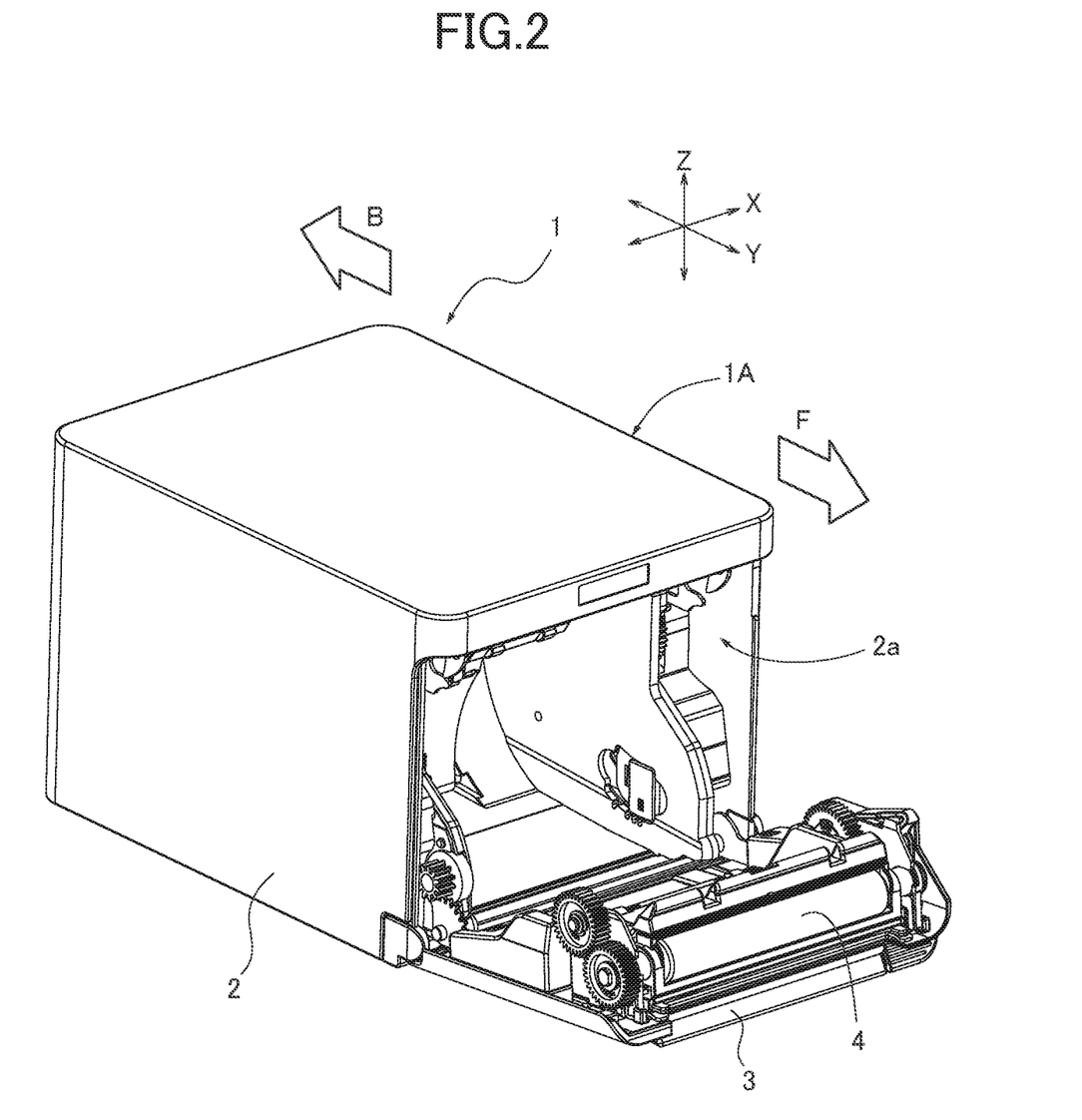
FIG. 2 is a perspective view showing a state where the front cover of the thermal printer in the first embodiment is at an open position.
Figure 3:
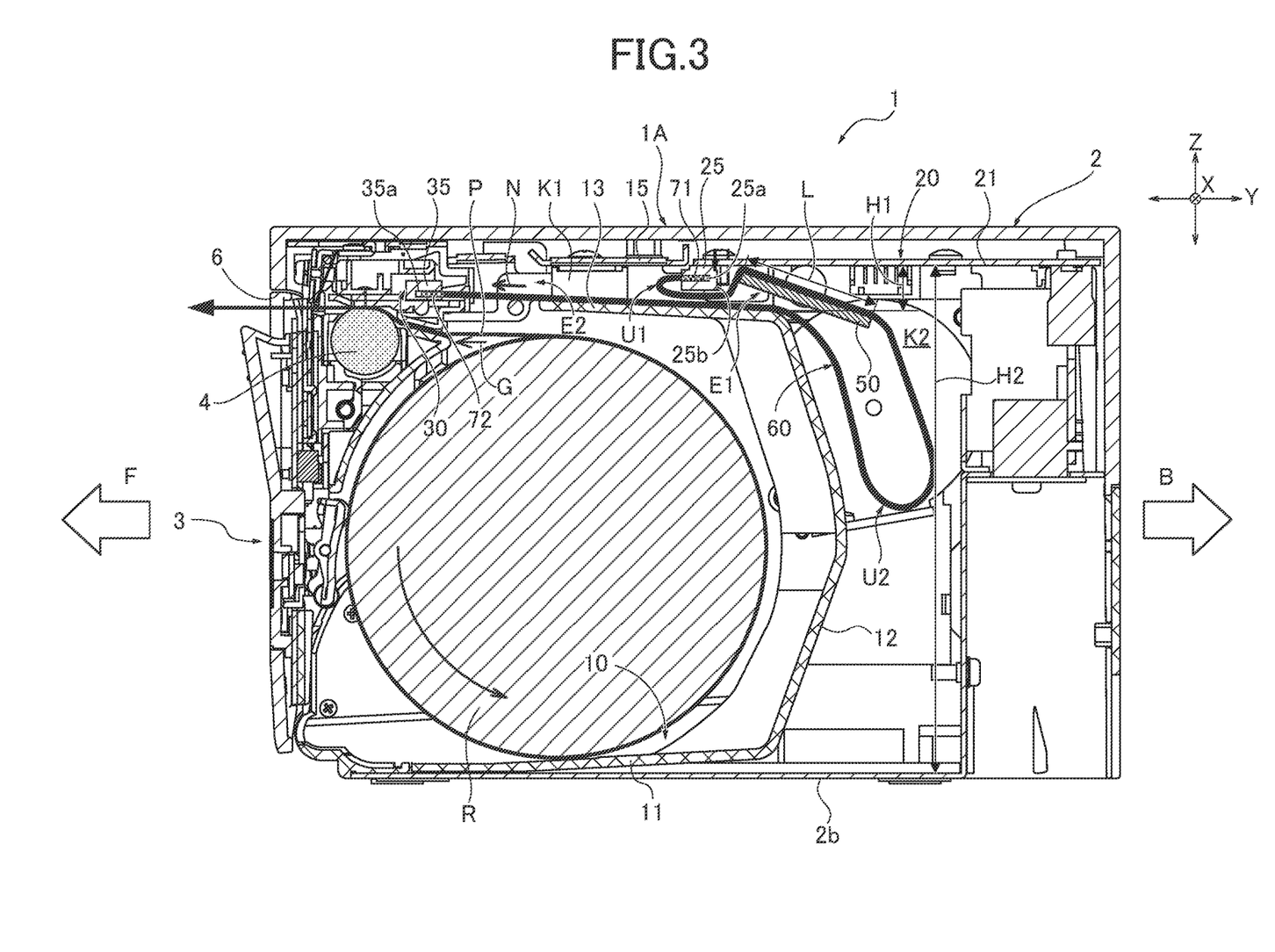
FIG. 3 is a cross-sectional view showing a configuration in a state where the front cover of the thermal printer in the first embodiment is at the closed position.

FIG. 1 is a perspective view showing a state where a front cover of the thermal printer in the first embodiment is at a closed position. FIG. 2 is a perspective view showing a state where the front cover of the thermal printer in the first embodiment is at an open position. FIG. 3 is a cross-sectional view showing a configuration in a state where the front cover of the thermal printer in the first embodiment is at the closed position. Hereinafter, the configuration of the thermal printer in the first embodiment will be described with reference to FIG. 1 to FIG. 3.

Here, the width direction of the thermal printer 1 is defined as a width direction X, the front-back direction of the thermal printer 1 is defined as a front-back direction Y, and the up-down direction of the thermal printer 1 is defined as an up-down direction Z. Here, in the front-back direction Y, the frontward direction is defined as a frontward direction F, and the backward direction is defined as a backward direction B.

As shown in FIG. 1, the thermal printer 1 as the image forming apparatus includes a housing 1A that is equipped with a housing body 2 and the front cover 3.

As shown in FIG. 2, the housing body 2 is formed in a box shape and has an opening portion 2a on the front side of the thermal printer 1. The front cover 3 is supported with an axis on a lower-side edge of the opening portion 2a and is rotatable between a closed position to close the opening portion 2a and an open position to open the opening portion 2a. The front cover 3 is at the open position when falling from the upright state in the frontward direction F and is at the closed position when rising from the fallen state, thereby being able to open and close in the frontward direction F.

As shown in FIG. 3, an accommodating portion 10, a guiding portion 15, a control board 20, a thermal head unit 30, a first passage K1, a second passage K2, and a cable 60 are provided inside the housing body 2.

The accommodating portion 10 includes a bottom partitioning portion 11, a back partitioning portion 12, and an upper partitioning portion 13 and makes it possible to accommodate rolled paper R. The rolled paper R is a long continuous paper sheet wound in a roll.

Near a bottom surface 2b of the housing body 2, the bottom partitioning portion 11 is formed of a slope surface inclined downward in the frontward direction F of the thermal printer 1. The back partitioning portion 12 is formed so as to stand up from a back-side end portion of the bottom partitioning portion 11. The upper partitioning portion 13 is formed so as to extend from the upper end of the back partitioning portion 12 in the frontward direction F.

The guiding portion 15 is disposed above the upper partitioning portion 13 with a predetermined space. The guiding portion 15 is formed in a plate shape that extends in the front-back direction Y.

The control board 20 is disposed backward the guiding portion 15. A first connector 25 as a first component is attached to a reverse surface (lower surface in FIG. 3) of the control board 20. The first connector 25 is disposed in the first passage K1.

The first connector 25 includes a first insertion port 25a into which a first terminal 71 being one end portion of the cable 60 is detachably attached. The first insertion port 25a is formed in the frontward direction F. A side surface at rear side of the first connector 25 configures a side wall 25b that extends from the control board 20 towards the cable 60.

The thermal head unit 30 is disposed more frontward than the upper partitioning portion 13. The thermal head unit 30 is attached with a second connector 35 as a second component. The second connector 35 is disposed frontward the first passage K1.

The second connector 35 includes a second insertion port 35a into which a second terminal 72 provided at the other end portion of the cable 60 is detachably attached. The second insertion port 35a is formed towards the backward direction B.

The thermal head unit 30 is configured to be removable in the frontward direction F from the housing body 2 when the front cover 3 is at the open position. That is, the thermal head unit 30 is configured to be removable in a direction away from the first connector 25.

When the front cover 3 is at the closed position, a platen roller 4 attached to the front cover 3 is disposed to oppose the thermal head unit 30. The thermal head unit 30 performs thermal printing on a recording paper P while being pressed to the platen roller 4 to be contacted therewith.

A space formed by the upper partitioning portion 13, the guiding portion 15, and the control board 20 configures the first passage K1. The first passage K1 includes an entrance E1 that opens to the backward direction B and an exit E2 that opens to the frontward direction F. At the entrance E1 of the first passage K1, the ceiling height of the first passage K1 is a ceiling height H1. Here, the ceiling height of the first passage K1 is a distance from the top surface of the upper partitioning portion 13 to the lower surface of the control board 20 in the entrance E1 of the first passage K1.

A space surrounded by the back partitioning portion 12, the bottom surface 2b of the housing body 2, and the control board 20 configures the second passage K2. The second passage K2 is formed backward the first passage K1. The second passage K2 is configured as a space that connects with the entrance E1 of the first passage K1.

The ceiling height H2 of the second passage K2 is higher than the ceiling height H1 of the first passage K1. Here, the ceiling height of the second passage K2 is a distance from the bottom surface 2b of the housing body 2 to the lower surface of the control board 20. With this, the bottom portion of the second passage K2 is positioned lower than the bottom portion of the entrance E1 of the first passage K1.

The platen roller 4 is attached to the back surface of the front cover 3. The platen roller 4 is connected to a not-shown motor and conveys a recording paper P fed from the rolled paper R to a discharge port 6 as a paper feed roller.

In the thermal printer 1 configured as described above, a recording paper P is fed out from the rolled paper R as the platen roller 4 rotates. The recording paper P fed out from the rolled paper R is conveyed in a conveyance direction G, and thermal printing is performed by the thermal head unit 30. The recording paper P on which the thermal printing has been performed is discharged from the discharge port 6.

Configuration of Cable

Figure 4:
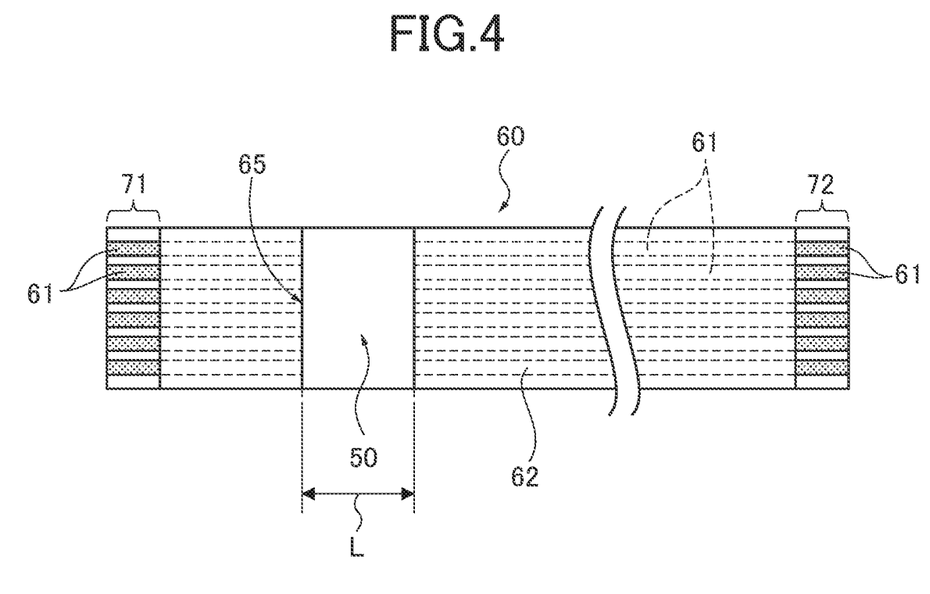
FIG. 4 is a plan view for describing a configuration of a cable in the first embodiment.
Figure 5:
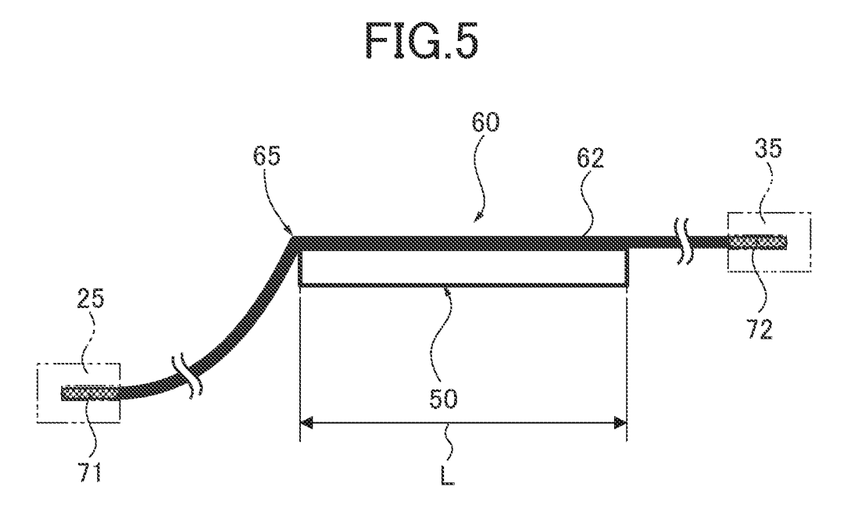
FIG. 5 is a schematic drawing for describing the configuration of the cable in the first embodiment.

FIG. 4 is a plan view for describing a configuration of the cable in the first embodiment. FIG. 5 is a schematic drawing for describing the configuration of the cable in the first embodiment. Hereinafter, the configuration of the cable in the first embodiment will be described with reference to FIG. 3 to FIG. 5.

The cable 60 may be, for example, a flexible flat cable (FFC). As shown in FIG. 3, the cable 60 extended from the first connector 25 in the frontward direction F is folded back in the first passage K1 to the backward direction B, folded back again in the second passage K2 to the frontward direction F, and connected to the second connector 35.

Here, a portion at which the cable 60 is folded back in the first passage K1 is referred to as a first folded-back portion U1, and a portion at which the cable 60 is folded back in the second passage K2 is referred to as a second folded-back portion U2.

When the thermal head unit 30 is removed from the housing body 2 in the frontward direction F, the cable 60 is pulled in a pulling-out direction N together with the thermal head unit 30.

It should be noted that the pulling-out direction N means a direction in which the cable 60 is pulled and moves by removing the thermal head unit 30 from the housing body 2 in the frontward direction F.

As shown in FIG. 4 and FIG. 5, the cable 60 includes a flat conductor 61 and an insulating coating 62. The cable 60 is provided with a rigid portion 50.

A plurality of flat conductors 61 are formed of belt-shaped metal plates or metallic foils and are arranged in parallel with predetermined intervals.

The insulating coating 62 is formed of an insulating material and covers the plurality of flat conductors 61. The both ends of the flat conductors 61 are not covered with the insulating coating 62, but the flat conductors 61 are exposed at the both ends. One end portion of the flat conductors 61 configures the first terminal 71 that is detachably attached to the first insertion port 25a of the first connector 25. The other end portion of the flat conductors 61 configures the second terminal 72 that is detachably attached to the second insertion port 35a of the second connector 35.

As shown in FIG. 3, the rigid portion 50 is attached to a lower surface of the cable 60 between the first folded-back portion U1 and the second folded-back portion U2 with, for example, a double-sided tape. In other words, the rigid portion 50 is attached to an inner surface of the cable 60 formed by the second folded-back portion U2. The rigid portion 50 is disposed backward than the first connector 25. The rigid portion 50 is formed to have more rigidity than the cable 60. The rigid portion 50 is formed of, for example, a resin, such as polyethylene terephthalate (PET), and has a rectangular plate shape with a thickness of 0.25 mm.

The rigid portion 50 has a length L longer than the ceiling height H1 of the first passage K1 in the longitudinal direction of the cable 60. In other words, the rigid portion 50 is formed such that the length L in the pulling-out direction N of the cable 60 is longer than the ceiling height H1 of the first passage K1.

As shown in FIG. 4 and FIG. 5, at the end portion of the rigid portion 50 close to the first connector, the cable 60 has a bent portion 65 at which the cable 60 is bent toward the rigid portion 50 to have a crease.

Motion of Cable

Figure 6:
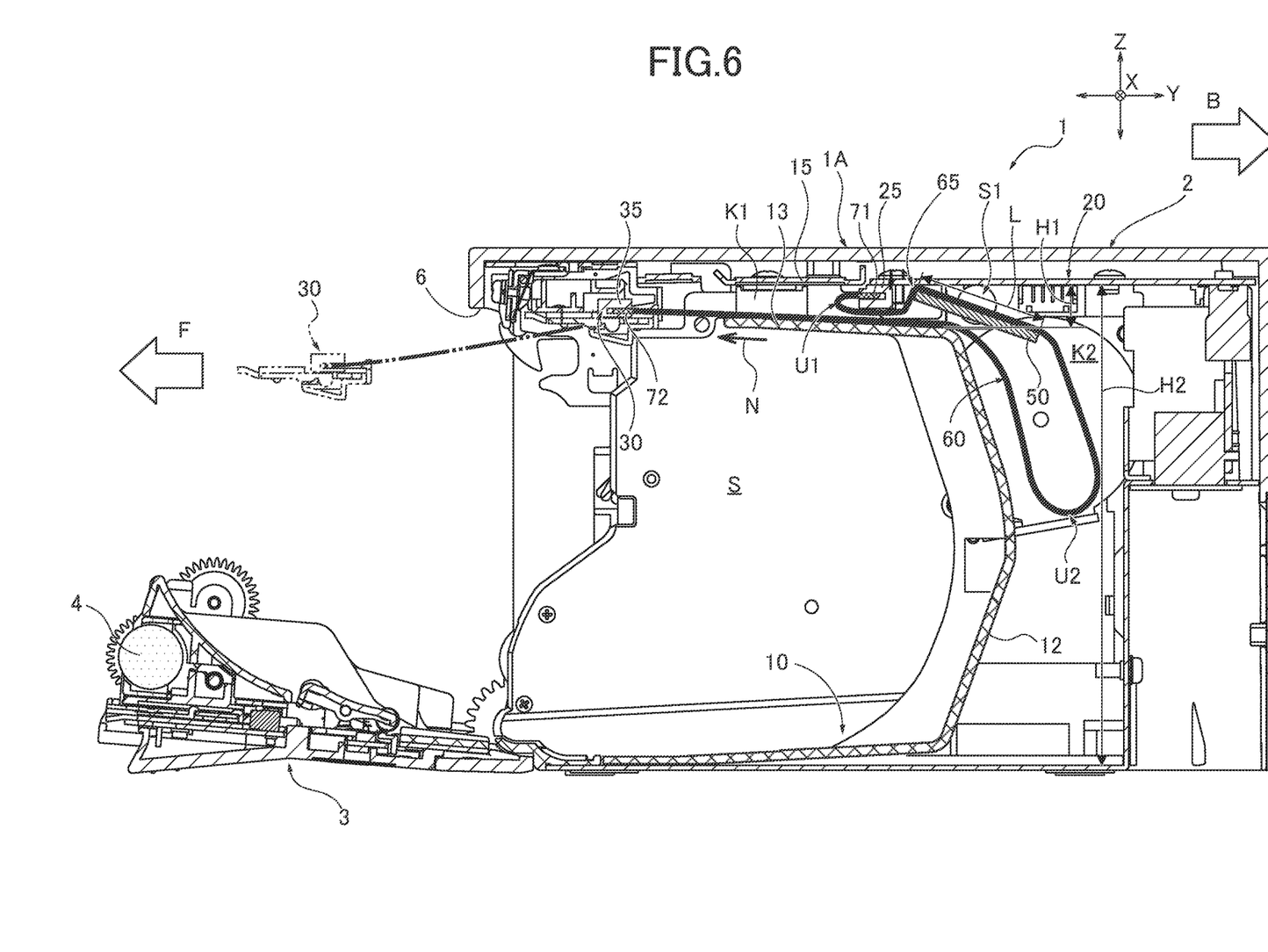
FIG. 6 is a cross-sectional view for describing a motion of the cable in the first embodiment.
Figure 7:
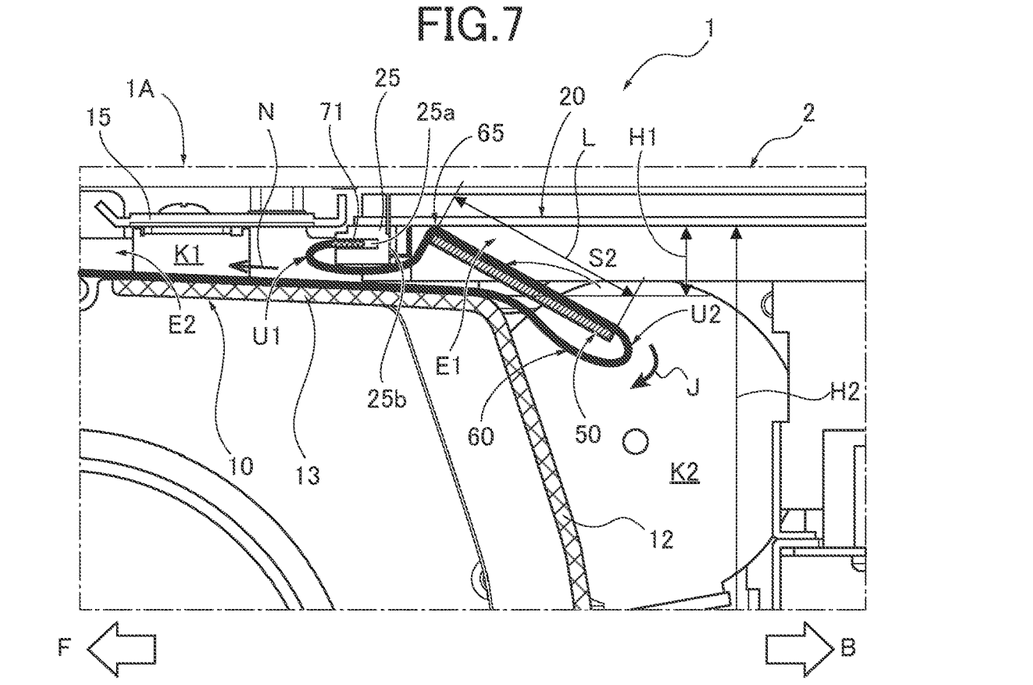
FIG. 7 is a cross-sectional view for describing a motion of the cable in the first embodiment.
Figure 8:
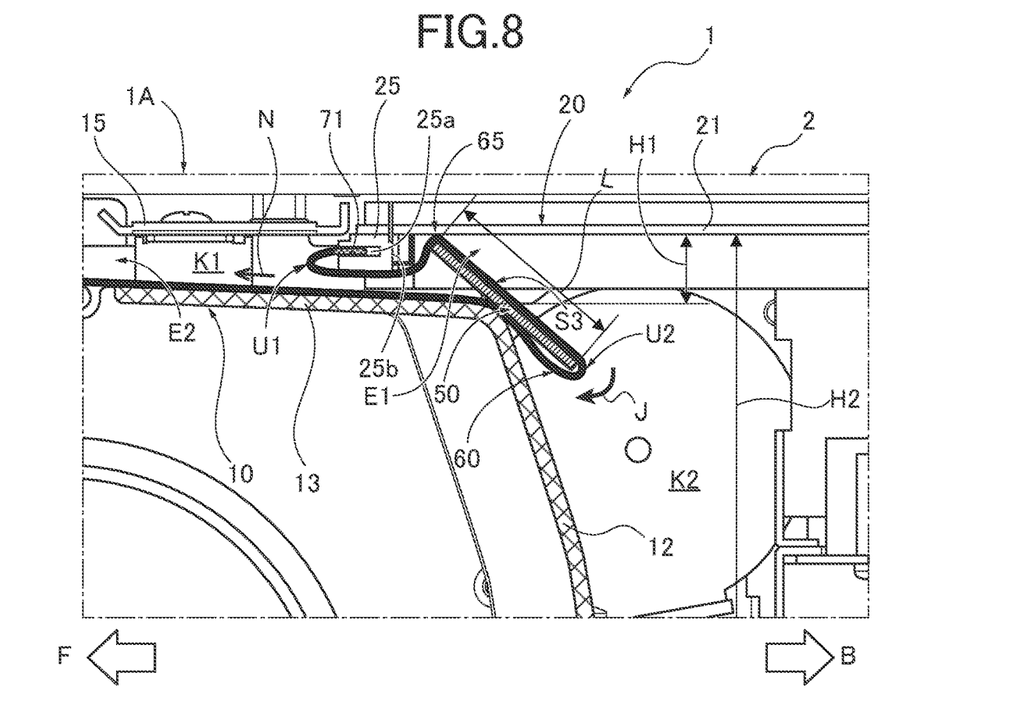
FIG. 8 is a cross-sectional view for describing a motion of the cable in the first embodiment.

FIG. 6 to FIG. 8 are cross-sectional views for describing the motion of the cable 60 in the first embodiment. Hereinafter, the motion of the cable in the first embodiment will be described with reference to FIG. 6 to FIG. 8.

As shown in FIG. 6, when the thermal head unit 30 is attached to the housing body 2, the rigid portion 50 is in a first inclined posture S1 in which the rigid portion 50 inclines downward in the backward direction B due to the bent portion 65.

When the front cover 3 is at the open position and the thermal head unit 30 is removed from the housing body 2 in the frontward direction F, the cable 60 is pulled in the pulling-out direction N. Upon the cable 60 being pulled in the pulling-out direction N, as shown in FIG. 7, the rigid portion 50 turns around the end portion of the rigid portion 50 close to the first connector 25 as a fulcrum in a first direction J so as to block the entrance E1 of the first passage K1 and becomes a second inclined posture S2. Here, although the rigid portion 50 moves in the frontward direction as the cable 60 being pulled in the pulling-out direction N, the rigid portion 50 stops at a rear side wall 25 of the first connector 25. As shown in FIG. 7 and FIG. 8, when the cable 60 has a high rigidity, the part of the cable 60 between the end portion of the rigid portion 50 close to the first connector 25 and the rear side wall 25b of the first connector 25 is bent and abuts on near the lower edge of the rear side wall 25b of the first connector 25.

Upon the cable 60 being further pulled in the pulling-out direction N, as shown in FIG. 8, the rigid portion 50 further turns around the end portion of the rigid portion 50 close to the first connector 25 as a fulcrum in the first direction J, and the rigid portion 50 becomes a standing posture S3 standing up to block the entrance E1 of the first passage K1. With this, the rigid portion 50 achieves a function as a stopper to prevent the cable 60 from being further pulled in the pulling-out direction N.

Acts of Cable Stopper Structure and Image Forming Apparatus

Acts of the cable stopper structure and image forming apparatus in the first embodiment will be described. The cable stopper structure in the first embodiment includes the cable 60 disposed throughout the first passage K1 and the second passage K2 connecting with the entrance E1 of the first passage K1 and having a ceiling height H2 higher than that of the first passage K1. The cable stopper structure further includes a first component (first connector 25) disposed on the first passage K and connected to one end portion (first terminal 71) of the cable 60, and a second component (second connector 35) disposed near the exit E2 of the first passage K1 and connected to the other end portion (second terminal 72) of the cable 60. The second component is configured to be removable in a direction (frontward direction F) away from the first component (first connector 25). The cable 60 includes a folded-back portion (second folded-back portion U2) folded back in the second passage K2 and a rigid portion 50 that is disposed at a position between the folded-back portion (second folded-back portion U2) and the first component (first connector 25). The rigid portion has a rigidity greater than that of the cable 60 and has a length in the pulling-out direction N of the cable 60 longer than the ceiling height H1 of the first passage K1 (see FIG. 3).

With this, when a component (thermal head unit 30) attached with the second component (second connector 35) is removed and the cable 60 is pulled excessively, the rigid portion is caught at the entrance E1 of the first passage K1. Therefore, the cable 60 is prevented from being pulled excessively. As a result, it is possible to prevent, with a simple configuration, a trouble such as disconnection of the cable 60 from the first component (first connector 25).

In the case of an apparatus (thermal printer 1) that does not include the cable stopper structure shown in the first embodiment, when the cable 60 is pulled excessively and disconnected from the first component (the first connector 25), it is necessary to disassemble the apparatus (thermal printer 1) in order to reconnect the cable 60.

In the cable stopper structure in the first embodiment, the cable 60 has the bent portion 65 at the end portion of the rigid portion 50 close to the first component (first connector 25) (see FIG. 5).

With this, when the cable 60 is accommodated the inside of the housing body 2, it is possible to keep the rigid portion 50 in the first inclined posture S1 in which the rigid portion 50 is inclined. Therefore, when the component (thermal head unit 30) attached with the second component (second connector 35) is removed and the cable 60 is pulled excessively, the posture of the cable 60 is easily placed in the standing posture S3. As a result, the rigid portion 50 is caught at the entrance E1 of the first passage K1 and functions as a stopper, whereby it is possible to prevent, with a simple configuration, a trouble such as disconnection of the cable 60 from the first component (first connector 25).

The cable stopper structure in the first embodiment includes the side wall 25b that is disposed between the first component (first connector 25) and the rigid portion 50, and the side wall 25b extends toward the cable 60 (see FIG. 3).

With this, when the cable 60 is pulled in the pulling-out direction N, the end portion of the rigid portion 50 close to the first component (first connector 25) abuts on the side wall 25b. Therefore, it is possible to reliably turn the rigid portion 50 around the end portion of the rigid portion 50 close to the first component (first connector 25) as a fulcrum and to place the posture of the cable 60 in the standing posture S3. As a result, the rigid portion 50 is caught at the entrance E1 of the first passage K1 and functions as a stopper, whereby it is possible to prevent, with a simple configuration, a trouble such as disconnection of the cable 60 from the first component (first connector 25).

In the cable stopper structure in the first embodiment, the cable 60 is a flexible flat cable or a flexible printed board (see FIG. 4).

With this, when the cable 60 is pulled excessively, it is possible to easily place the posture of the cable 60 in the standing posture S3. As a result, the rigid portion 50 is caught at the entrance E1 of the first passage K1 and functions as a stopper, whereby it is possible to prevent, with a simple configuration, a trouble such as disconnection of the cable 60 from the first component (first connector 25).

In the cable stopper structure in the first embodiment, the rigid portion 50 is a plate-shaped component attached to an inner surface of the cable 60 formed by the folded-back portion (second folded-back portion U2) (see FIG. 3).

With this, when the cable 60 is pulled in the pulling-out direction N, it is possible to move the cable 60 so as to turn the rigid portion 50. Therefore, it is possible to prevent the rigid portion 50 from being peeled off from the cable 60. In contrast to this, if the rigid portion 50 is attached to an outer surface (surface of the cable 60 facing the control board 20) of the cable 60, the cable 60 is pulled in the state where the rigid portion 50 is directly in contact with the side wall 25b. Therefore, the force to pull the cable 60 acts in a direction in which the cable 60 is peeled off from the rigid portion 50. As a result, in the case where the rigid portion 50 is attached to the outer surface of the cable 60, the rigid portion 50 is easily peeled off from the cable 60 compared to the case where the rigid portion 50 is attached to the inner surface of the cable 60. However, if the rigid portion 50 can be adhered firmly on the outer surface of the cable 60 to such an extent not to be peeled off, the rigid portion 50 may be attached to the outer surface of the cable 60.

In the above, the image forming apparatus of the present disclosure is described on the basis of the first embodiment. However, the specific configuration is not limited to this embodiment, and changes, additions, or the like of the design may be allowed without departing from the gist of the invention according to each claim.

Figure 9:
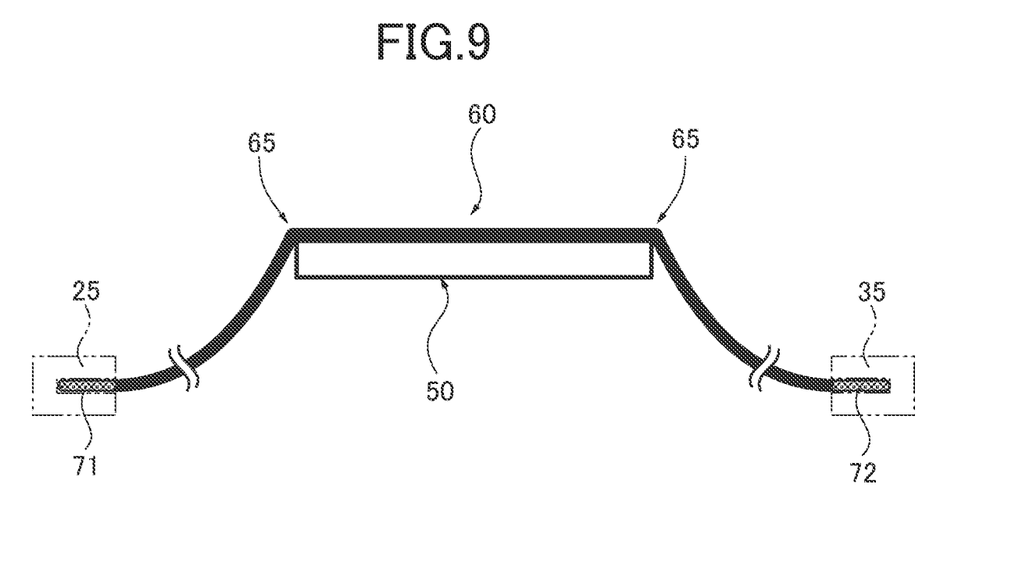
FIG. 9 is a schematic drawing for describing a configuration of a cable in another embodiment.

In the first embodiment, the bent portion 65 is exemplarily provided at the end portion of the rigid portion 25 close to the first connector 25. However, as shown in FIG. 9, the bent portion 65 of the cable 60 may be also provided at the end portion of the rigid portion 50 close to the second connector 35.

Figure 10:
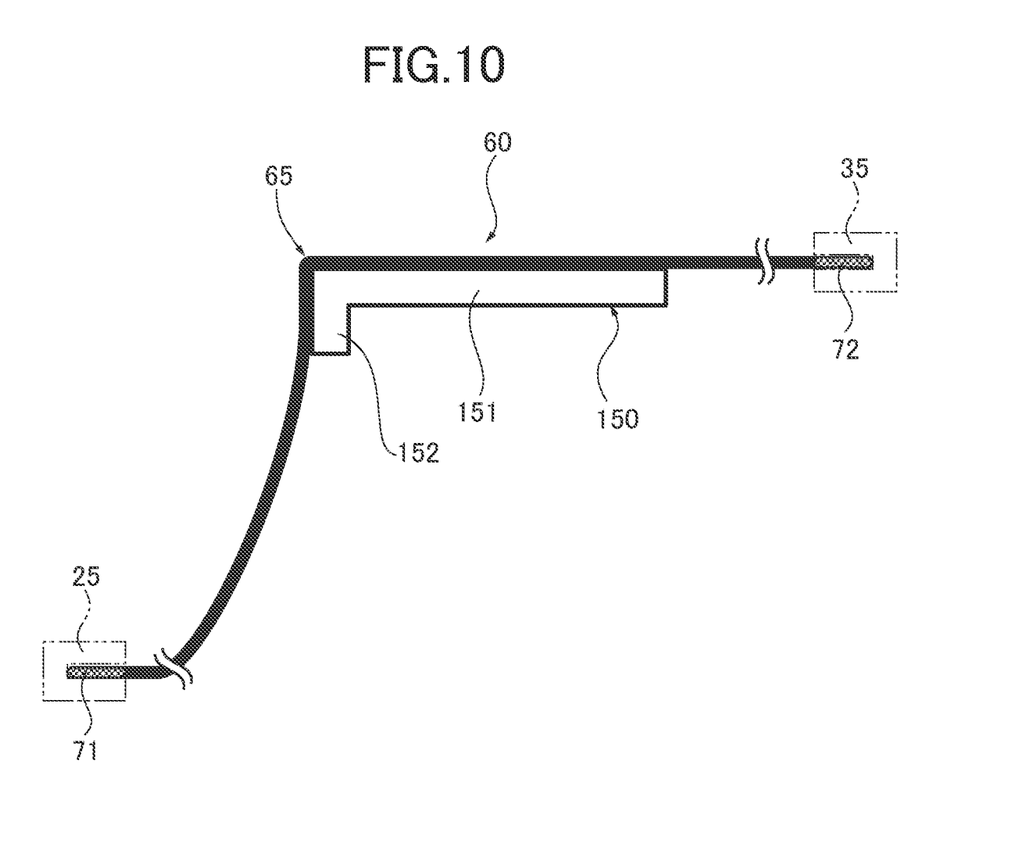
FIG. 10 is a schematic drawing for describing a configuration of a cable in another embodiment.

In the first embodiment, the rigid portion 50 is exemplarily formed in the rectangular plate shape. However, as shown in FIG. 10, the rigid portion 150 may be formed of a rigid portion body 151 and a flange portion 152 to have an L-shaped cross section. In this case, it is easy to form the bent portion 65 by adhering the cable 60 to the rigid portion body 151 and the flange portion 152. Moreover, the rigid portion may be formed such that a part of the insulating coating has rigidity.

Furthermore, only a part of the rigid portion 50 in the width direction of the cable 60 may be formed such that its length L in the pulling-out direction N of the cable 60 is longer than the ceiling height H1 of the first passage K1. That is, if the rigid portion 50 includes a portion whose length L in the pulling-out direction N of the cable 60 is formed longer than the ceiling height H1 of the first passage K1, the portion functions as a stopper.

Moreover, the width of the rigid portion 50 may not be the same as the width of the cable 60 and may be made longer or shorter than the width of the cable 60.

In the first embodiment, the cable 60 is exemplarily a flexible flat cable. However, the cable is not limited thereto and may be a flexible printed board, for example.

In the first embodiment, the bent portion 65 is exemplarily provided to the cable 60. However, the bent portion may not be provided to the cable. In this case, when the thermal head unit 30 is attached to the housing body 2, the rigid portion 50 becomes an inclined posture similar to the first inclined posture S1 that inclines downward in the backward direction B by the bent portion 65. With this, the end portion of the rigid portion 50 close to the first connector 25 is lifted upward and becomes a posture that is easy to abut on the backward side wall 25b of the first connector 25.

In the first embodiment, the second connector 35 is exemplarily attached to the thermal head unit 30. However, the second connector may be attached to a cutter unit, an operation panel, or the like that needs to be replaced depending on the status of use.

In the first embodiment, the rigid portion 50 is exemplarily attached to an inner surface of the cable 60 formed by the second folded-back portion U2. However, as mentioned above, the rigid portion may be attached to an outer surface of the cable 60 formed by the second folded-back portion U2.

In the first embodiment, the first insertion port 25a is exemplarily formed towards the frontward direction F. However, the first insertion port may be formed towards the backward direction B.

In the first embodiment, the backward side surface of the first connector 25 is exemplarily formed as the side wall 25b that extends from the control board 20 towards the cable 60. However, the side wall is not limited thereto and may be formed as a side surface of a protruding portion that protrudes from the control board 20 toward the cable 60. For example, a dedicated member may be provided on the control board 20 or a circuit component mounted on the control board 20 other than the first connector 25 may be used as the protruding portion.

In the first embodiment, the stopper structure of the present disclosure is exemplarily applied to the image forming apparatus equipped with the front cover 3 that opens the front side thereof. However, the stopper structure of the present disclosure may be also applied to an image forming apparatus equipped with an upper cover that opens the upper side thereof In the first embodiment, the present disclosure is exemplarily applied to a thermal printer 1 that performs printing on a thermal paper. However, the present disclosure may be applied to a thermal transfer printer adapted to use an ink ribbon. Moreover, the present disclosure may be also applied to an image forming apparatus such as an impact type printer, a laser printer, an ink-jet printer, a plotter, a word processor, a facsimile, a copying machine, and a composite machine having two or more functions of them.

The invention claimed is:

1. A cable stopper structure, comprising:
    a cable that is disposed throughout a first passage and a second passage, the second passage being connected to an entrance of the first passage and having a ceiling height higher than a ceiling height of the first passage;
    a first component that is disposed in the first passage and connected to one end portion of the cable; and
    a second component that is disposed near an exit of the first passage and connected to the other end portion of the cable, the second component being configured to be removable in a direction away from the first component,
    wherein the cable comprises a folded-back portion that is folded back in the second passage and a rigid portion that is disposed at a position between the folded back portion and the first component, wherein the rigid portion has a rigidity greater than that of the cable and has a length in a pulling-out direction of the cable longer than the ceiling height of the first passage, and wherein the rigid portion functions as a stopper that prevents the cable from being disconnected from the first component when the cable is pulled out in the direction away from the first component by the rigid portion engaging a wall inside a device in which the first component is located, the wall being in a fixed position relative to the first component.

2. The cable stopper structure according to claim 1, wherein the cable comprises a bent portion at an end portion of the rigid portion close to the first component.

3. The cable stopper structure according to claim 1, comprising a side wall that is disposed between the first component and the rigid portion and extends towards the cable.

4. The cable stopper structure according to claim 1, wherein the cable is a flexible flat cable or a flexible printed board.

5. The cable stopper structure according to claim 4, wherein the rigid portion is a plate-shaped component that is attached to an inner surface of the cable formed by the folded-back portion.

6. An image forming apparatus, comprising:
the cable stopper structure according to claim 1.

7. A cable stopper structure, comprising:
a cable that has a cable path running through a first passage and a second passage of a device that houses the cable stopper structure, the second passage being open to the first passage at an entrance of the first passage and having a ceiling height higher than a ceiling height of the first passage, wherein the first passage is formed in part by a first wall and the second passage is formed in part by a second wall, and the first and second walls joining at the entrance;
a first component that is disposed in the first passage and connected to a first end portion of the cable; and
a second component that is disposed near an exit of the first passage and connected to a second end portion of the cable, the second component being removable from the device in a direction along the first passage and away from the first component, wherein the cable comprises a folded-back portion that is folded back in the second passage and a rigid portion that is disposed at a position between the folded back portion and the first component so that a first end of the rigid portion is in the first passage and the second end of the rigid portion is in the second passage, wherein the rigid portion has a rigidity greater than that of the cable and has a length in a pulling-out direction of the cable longer than the ceiling height of the first passage so that, under tension of a portion of the cable between the rigid portion and the second component, the rigid portion becomes lodged in the entrance of the first passage by the cable pulling the rigid portion rotationally toward the joining of the first and second walls with the first end of the rigid portion acting as a fulcrum of the rigid portion to keep the first end in the first passage and the second end in the second passage.

8. The cable stopper structure according to claim 7, wherein the cable comprises a bent portion at the first end of the rigid portion, the bent portion imparting an incline to the rigid portion relative to a longitudinal axis of the first passage.

9. The cable stopper structure according to claim 7, comprising a side wall that is disposed in the first passage between the first component and the rigid portion and that extends towards the cable, the side wall configured as a stop for the first end of the rigid portion.

10. The cable stopper structure according to claim 7, wherein the cable is a flexible flat cable or a flexible printed board.

11. The cable stopper structure according to claim 10, wherein the rigid portion is a plate-shaped component that is attached to an inner surface of the cable formed by the folded-back portion.

12. An image forming apparatus, comprising:
the cable stopper structure according to claim 7.

* * * * *